United States Patent
Honda et al.

(10) Patent No.: US 8,212,214 B2
(45) Date of Patent: Jul. 3, 2012

(54) SOLID-STATE IMAGING ELEMENT

(75) Inventors: Hiroto Honda, Yokohama (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,903

(22) Filed: Mar. 21, 2011

(65) Prior Publication Data

US 2011/0226953 A1    Sep. 22, 2011

Related U.S. Application Data

(63) Continuation of application No. PCT/JP2009/065493, filed on Sep. 4, 2009.

(30) Foreign Application Priority Data

Sep. 25, 2008    (JP) ................................. 2008-246300

(51) Int. Cl.
  *G01J 5/00* (2006.01)
  *G01J 5/20* (2006.01)
(52) U.S. Cl. ................................. 250/338.3; 250/338.4
(58) Field of Classification Search ............... 250/338.1, 250/338.3, 332, 350, 352, 339.01, 339.02, 250/339.04, 330, 340; 438/57, 482, 619; 374/192, 121, 133, 170; 257/250, 227
See application file for complete search history.

(56) References Cited

U.S. PATENT DOCUMENTS

| | | | |
|---|---|---|---|
| 5,461,231 A | 10/1995 | Sugimoto et al. | |
| 5,486,698 A * | 1/1996 | Hanson et al. | 250/332 |
| 5,883,382 A | 3/1999 | Asada | |
| 6,367,972 B1 * | 4/2002 | Kamiyama et al. | 374/133 |
| 6,441,372 B1 | 8/2002 | Kawahara | |
| 6,552,345 B2 | 4/2003 | Asano et al. | |
| 6,599,771 B2 * | 7/2003 | Mashio et al. | 438/57 |
| 7,026,617 B2 | 4/2006 | Mashio et al. | |
| 2005/0061980 A1 * | 3/2005 | Iida et al. | 250/338.4 |

FOREIGN PATENT DOCUMENTS

| | | |
|---|---|---|
| JP | 6-323905 | 11/1994 |
| JP | 8-201166 | 8/1996 |
| JP | 9-292277 | 11/1997 |
| JP | 11-51764 | 2/1999 |
| JP | 11-230605 | 8/1999 |
| JP | 2000-111397 | 4/2000 |

(Continued)

OTHER PUBLICATIONS

Ishikawa et al., "Low-cost 320 × 240 uncooled IRFPA using conventional silicon IC process," SPIE Conference on Infared Technology and Applications XXV, SPIE vol. 3698, pp. 556-564, Apr. 1999.

(Continued)

*Primary Examiner* — David Porta
*Assistant Examiner* — Faye Boosalis
(74) *Attorney, Agent, or Firm* — Oblon, Spivak, McClelland, Maier & Neustadt, L.L.P.

(57) ABSTRACT

It is possible to quickly and readily determine the location of an object. A solid-state imaging element according to an embodiment includes: at least two infrared detectors formed on a semiconductor substrate; an electric interconnect configured to connect the at least two infrared detectors in series; and a comparator unit configured to compare an intermediate voltage of the electric interconnect connecting the infrared detectors in series, with a predetermined reference voltage.

7 Claims, 7 Drawing Sheets

FOREIGN PATENT DOCUMENTS

| | | |
|---|---|---|
| JP | 2001-318166 | 11/2001 |
| JP | 2003-65842 | 3/2003 |
| JP | 2004-117277 | 4/2004 |
| JP | 2005-188970 | 7/2005 |
| WO | WO 97/46896 | 12/1997 |

OTHER PUBLICATIONS

English translation of International Preliminary Report on Patentability and Written Opinion of the International Searching Authority issued May 19, 2011, in PCT/JP2009/065493.

* cited by examiner

A—A CROSS-SECTION

SOLID-STATE IMAGING ELEMENT

FIELD

Embodiments described herein relate generally to a solid-state imaging element of an uncooled type (a thermal type) with respect to the far-infrared band.

BACKGROUND

Infrared sensors compatible mainly with infrared rays in an 8 μm to 12 μm band are used for security cameras and in-vehicle forward-monitoring cameras, being highly sensitive to infrared rays emitted from objects with temperatures particularly close to room temperature. In recent years, as the MEMS (Micro-Electro-Mechanical System) process has developed, uncooled (thermal) infrared sensors are being more and more widely used to detect infrared rays, without cooling devices.

A thermal infrared sensor uses pixels that are arranged in an array on a semiconductor substrate and are thermally isolated from the semiconductor substrate, to absorb infrared rays gathered by a lens for far-infrared rays (a Ge lens in most cases). The thermal infrared sensor thermoelectrically converts the temperature rise occurring in the pixels into electrical signals, and reads the electrical signals. The thermal infrared sensor then forms an image based on the electrical signals. A thermal infrared sensor that has an interconnect layer simplified to lower the heat capacity of each cell and is capable of making quick responses has been suggested (see JP-A 2003-65842 (KOKAI), for example).

In the thermal infrared sensor disclosed in JP-A 2003-65842 (KOKAI), the heat capacity of each cell is lowered by simplifying the interconnect layer, so that quick responses can be made. In the thermal infrared sensor disclosed in JP-A 2003-65842 (KOKAI), however, the location of an object cannot be quickly and readily determined. Furthermore, since the thermal infrared sensor disclosed in JP-A 2003-65842 (KOKAI) is an image sensor, a scanning operation needs to be performed to read output signals by selectively scanning rows sequentially one by one, and such a scanning operation requires a longer time to read a larger number of rows. Therefore, the infrared response speed of the pixels cannot be advantageously utilized.

DETAILED DESCRIPTION

A solid-state imaging element according to an embodiment includes: at least two infrared detectors formed on a semiconductor substrate; an electric interconnect configured to connect the at least two infrared detectors in series; and a comparator unit configured to compare an intermediate voltage of the electric interconnect connecting the infrared detectors in series, with a predetermined reference voltage.

First Embodiment

Figure 1:
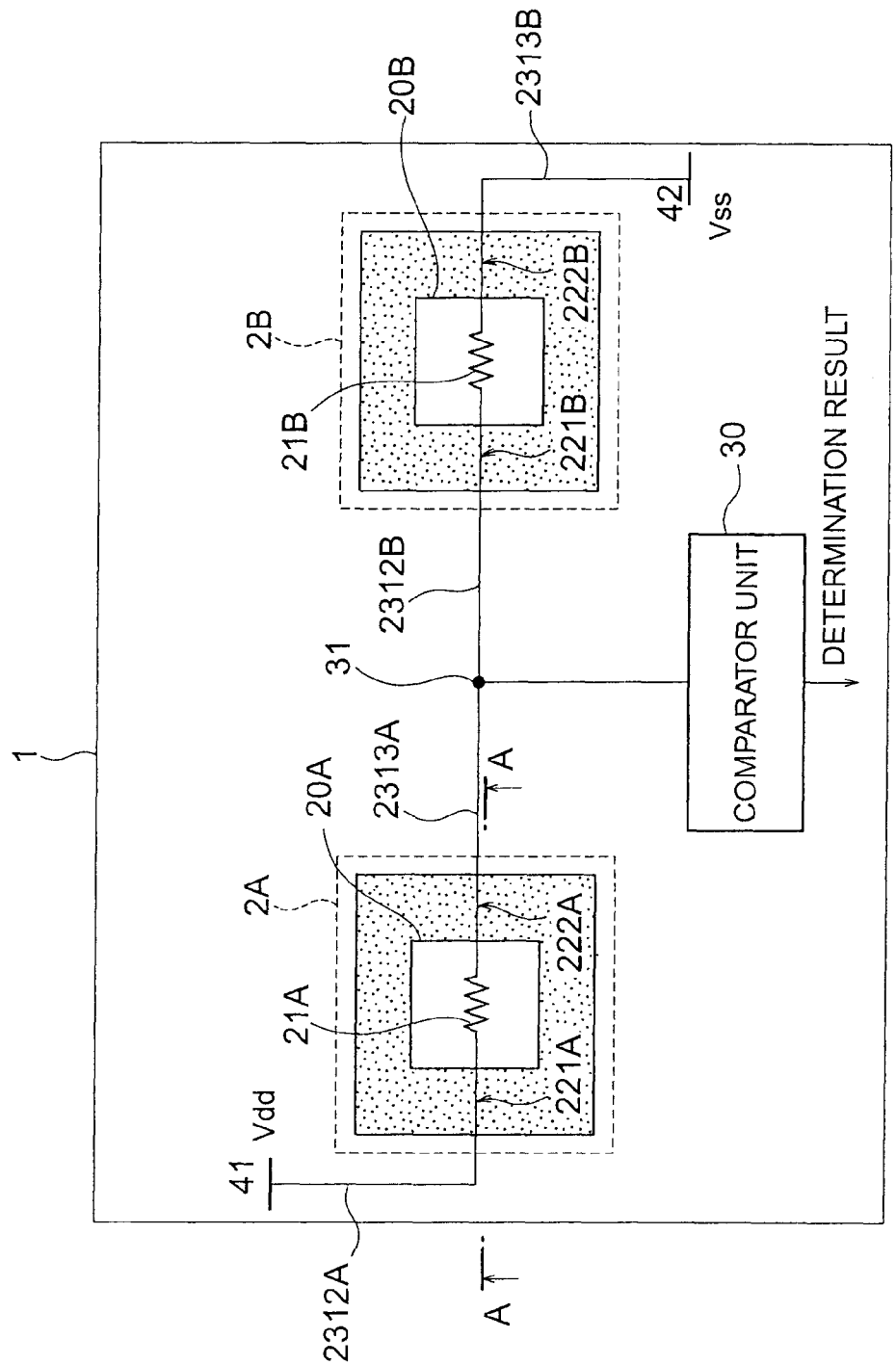
FIG. 1 is a plan view of a solid-state imaging element according to a first embodiment.
Figure 2:
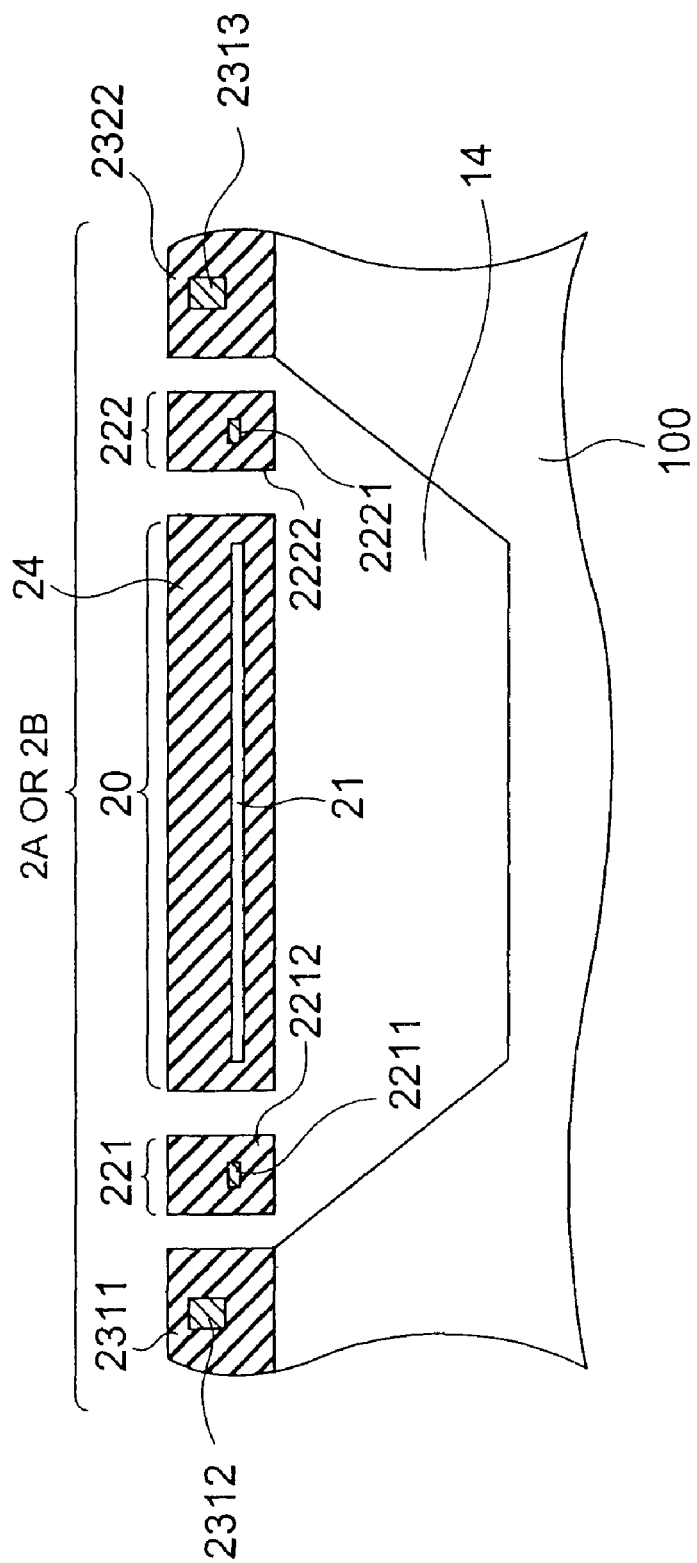
FIG. 2 is a cross-sectional view of the solid-state imaging element according to the first embodiment, taken along the line A-A of FIG. 1.

Referring to FIGS. 1 and 2, a solid-state imaging element according to a first embodiment of the present invention is described. FIG. 1 is a plan view of the solid-state imaging element of this embodiment, and FIG. 2 is a cross-sectional view of the solid-state imaging element, taken along the line A-A of FIG. 1. The solid-state imaging element 1 of this embodiment includes two pixels (infrared detectors) 2A and 2B, and a comparator unit 30. Each of the pixels 2A and 2B includes a cell unit 20, as shown in FIG. 2. The cell unit 20 is placed above a concave portion (a hollow portion) 14 formed in the surface of a semiconductor substrate such as a silicon substrate 100. The cell unit 20 is supported by supporting beams 221 and 222. The cell unit 20 includes a thermoelectric conversion element 21 and an infrared absorbing layer 24 covering the thermoelectric conversion element 21. The thermoelectric conversion element 21 is electrically insulated from the infrared absorbing layer 24, and is electrically connected to connection interconnects 2211 and 2221 placed in the supporting beams 221 and 222. Those connection interconnects 2211 and 2221 are covered with insulating films (protecting films) 2212 and 2222, respectively. The connection interconnects 2211 and 2221 are connected to interconnects 2312 and 2313 placed on the semiconductor substrate 100, respectively. The interconnects 2312 and 2313 are covered with insulating films 2311 and 2322, respectively. In the case of the pixel 2A, for example, the thermoelectric conversion element 21A is connected to the connection interconnects 221A and 222A placed in the supporting beams 221 and 222, as shown in FIG. 1. The connection interconnect 221A is connected to a Vdd power supply 41 via the interconnect 2312A placed on the semiconductor substrate 100, and the connection interconnect 222A is connected to the comparator unit 30 via the interconnect 2313A and a node 31 placed on the semiconductor substrate 100. In the case of the pixel 2B, the thermoelectric conversion element 21B is connected to the connection interconnects 221B and 222B placed in the supporting beams 221 and 222, as shown in FIG. 1. The connection interconnect 221B is connected to the comparator unit 30 via the interconnect 2312B and the node 31 placed on the semiconductor substrate 100. The connection interconnect 222B is connected to a Vss power supply 42 via the interconnect 2313B placed on the semiconductor substrate 100. The comparator unit 30 may be formed on the semiconductor substrate (a semiconductor chip) 100, or may be formed outside the semiconductor chip.

When an infrared ray from an object enters the solid-state imaging element of this embodiment having the above structure, the infrared ray is absorbed by the infrared absorbing layer 24 of each cell unit 20, and the temperature of the infrared absorbing layer 24 becomes higher by virtue of the generated thermal energy. The change in temperature is converted into an electrical signal by the thermoelectric conversion element 21, and is output as a pixel output. The comparator unit 30 then compares the outputs of the pixel 2A and the pixel 2B, to detect the location of the object.

As the solid-state imaging element of this embodiment operates in vacuum, the heat generated from each cell unit 20 can escape only through the supporting beams 221 and 222. Therefore, the thermal isolation properties of each cell unit 20 are determined by the heat conductance of the supporting beams 221 and 222. The heat insulation properties become higher as the supporting beams are made longer or thinner.

Where $G_{th}$ represents the heat conductance of the entire supporting mechanism, the temperature change $\Delta T$ in each cell unit 20 due to the thermal energy generated from the infrared absorbing layer 24 becomes higher according to the following equation:

$$\Delta T = \frac{P_a}{G_{th}}\{1 - \exp(-tG_{th}/C_{th})\} \quad (1)$$

Here, Pa represents the energy (W) of the infrared ray entering the cell unit 20, $C_{th}$ represents the thermal capacity (J/K) of the cell, and t represents the time (s) that has elapsed since the start of reception.

The temperature of the cell unit 20 enters a steady state, depending on a thermal time constant $\tau$. The thermal time constant is calculated according to the following equation:

$$\tau = C_{th}/G_{th} \quad (2)$$

Each cell unit 20 is a square approximately 30 μm on a side and is approximately 4 μm to 5 μm in height. The supporting mechanism that supports each cell unit 20 is formed by two supporting beams. Where the cross-section of the protecting film of each supporting beam is a square approximately 1 μm on a side, and the distance from the cell unit 20 to the protecting film for the connection interconnect is approximately 70 μm, the above described thermal time constant is on the order of approximately 20 msec to 50 msec. The temperature rise caused by reception of infrared rays in the cell is expressed as:

$$\Delta T_{IR} = \frac{P_a}{G_{th}} \quad (3)$$

To detect the temperature rise $\Delta T$ in each cell unit 20, a resistor is used as the thermoelectric conversion element 21 in this embodiment. The temperature rise in each cell unit 20 can be output as an electrical signal, with the resistance variation properties of the resistor 21 with respect to temperatures being utilized.

The resistance variation of the resistor 21 with temperature changes (a temperature-resistance coefficient) is expressed as dR/dT. In a case where TiN (titanium nitride) having a resistance value of 100 kΩ is used as the resistor 21, for example, a resistance change of 150Ω is seen with respect to a 1° C. change in temperature.

Here, the pixels 2A and 2B are formed at respective two locations on the semiconductor substrate 100, as shown in FIG. 1. Infrared rays emitted onto one of the pixels 2A and 2B, depending on the location of the object. In a case where infrared rays from the object are emitted only onto the pixel 2A, a temperature change expressed by the equation (3) occurs only in the pixel 2A.

The pixel 2A and the pixel 2B are connected by interconnects, and the Vdd power supply 41 and the Vss power supply 42 apply voltages in series to the pixel 2A and the pixel 2B. Where $R+\Delta R$ represents the resistance value of the resistor 21A, and R represents the resistance value of the resistor 21B, a current expressed by the following equation flows in the pixel 2A and the pixel 2B:

$$I = \frac{Vdd - Vssd}{2R + \Delta R} \quad (4)$$

Accordingly, the voltage V31 of the node 31 to which the connection interconnect 2313A and the connection interconnect 2312B are connected is expressed as follows:

$$V_{31} = \frac{Vdd - Vss}{2R + \Delta R}R + Vss \quad (5)$$

The comparator unit 30 compares the voltage V31 of the node with a threshold voltage Vth expressed by the following equation (6):

$$V_{th} = \frac{Vdd + Vss}{2} \quad (6)$$

As described above, in a case where infrared rays are emitted onto the pixel 2A, the voltage V31 of the node becomes lower than the threshold voltage Vth, as expressed by the following equation:

$$V_{31} - V_{th} = \frac{-\Delta R}{2(2R + \Delta R)}(Vdd - Vss) \quad (7)$$

In a case where infrared rays are emitted onto the pixel 2B, on the other hand, the result is the opposite from the above described case, as expressed by the following equation:

$$V_{31} - V_{th} = \frac{\Delta R}{2(2R + \Delta R)}(Vdd - Vss) \quad (8)$$

For example, where R is 1 MΩ, $\Delta R$ is 1 kΩ, Vdd is 5V, and Vss is −5 V, V31−Vth equals approximately 2.5 mV.

Figure 3:
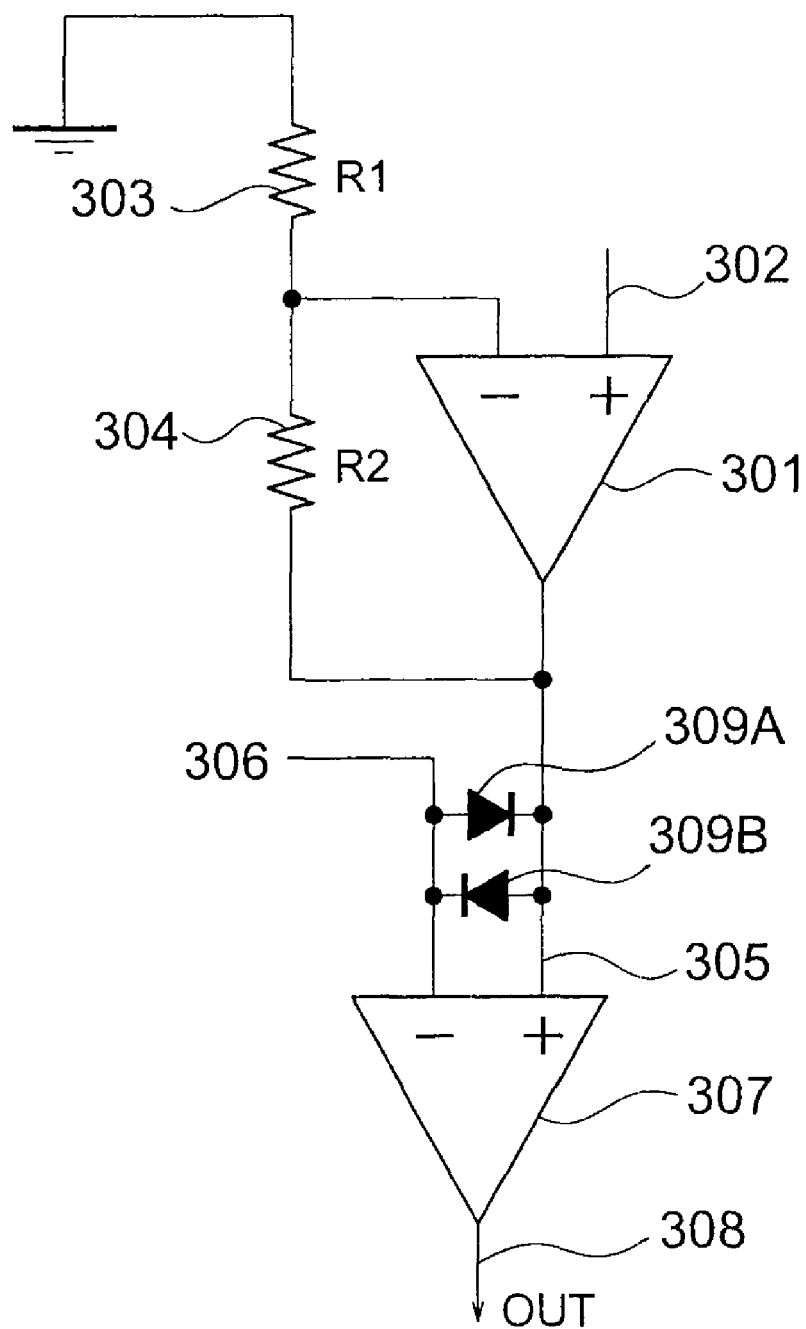
FIG. 3 is a circuit diagram of a specific example of the comparator unit according to the first embodiment.

FIG. 3 shows a specific example of the comparator unit 30. The input terminal of the comparator unit 30 of this specific example is equivalent to the input 302 of an operational amplifier 301. A resistance 303 and a resistance 304 are connected in series. One end of the resistance 303 is grounded, and one end of the resistance 304 is connected to the output terminal of the operational amplifier 301. The common connection node between the resistance 303 and the resistance 304 is connected to the inverting input terminal of the operational amplifier 301. With this structure, the operational amplifier 301 forms a noninverting amplifier circuit. As the amplification factor is expressed as "1+R2/R1", the amplification factor becomes approximately 1000 times higher where R2 is 1 MΩ and R1 is 1 kΩ.

The output of the noninverting amplifier circuit 301 is input to a comparator 307. The other input terminal 306 of the comparator 307 has a voltage fixed to the threshold voltage Vth to be compared with. A diode 309A and a diode 309B are connected to the two input terminals of the comparator 307, so that the output of the comparator 307 does not vary in a case where V31-Vth is very small, or so as to form a dead region. The comparator 307 recognizes the voltage difference between the two terminals when the voltage difference is large enough to supply a current to one of the diodes, or when the voltage difference is approximately 0.6 V. The output of the comparator 307 is either at the high level or at the low level, depending on the sign of V31-Vth.

As described above, the comparator unit 30 compares the voltage V31 of the node 31 with the threshold voltage Vth. By doing so, the comparator unit 30 can readily determine which one of the pixel 2A and the pixel 2B, located planarly at a distance from each other, has an infrared signal supplied thereto.

According to this embodiment, it is possible to determine readily and quickly the location of an object. Furthermore, even if there is a change in background temperature or chip temperature, the output signal is not affected by such a change, because the output signal is the result of an output of the difference between two pixels.

Second Embodiment

Figure 4:
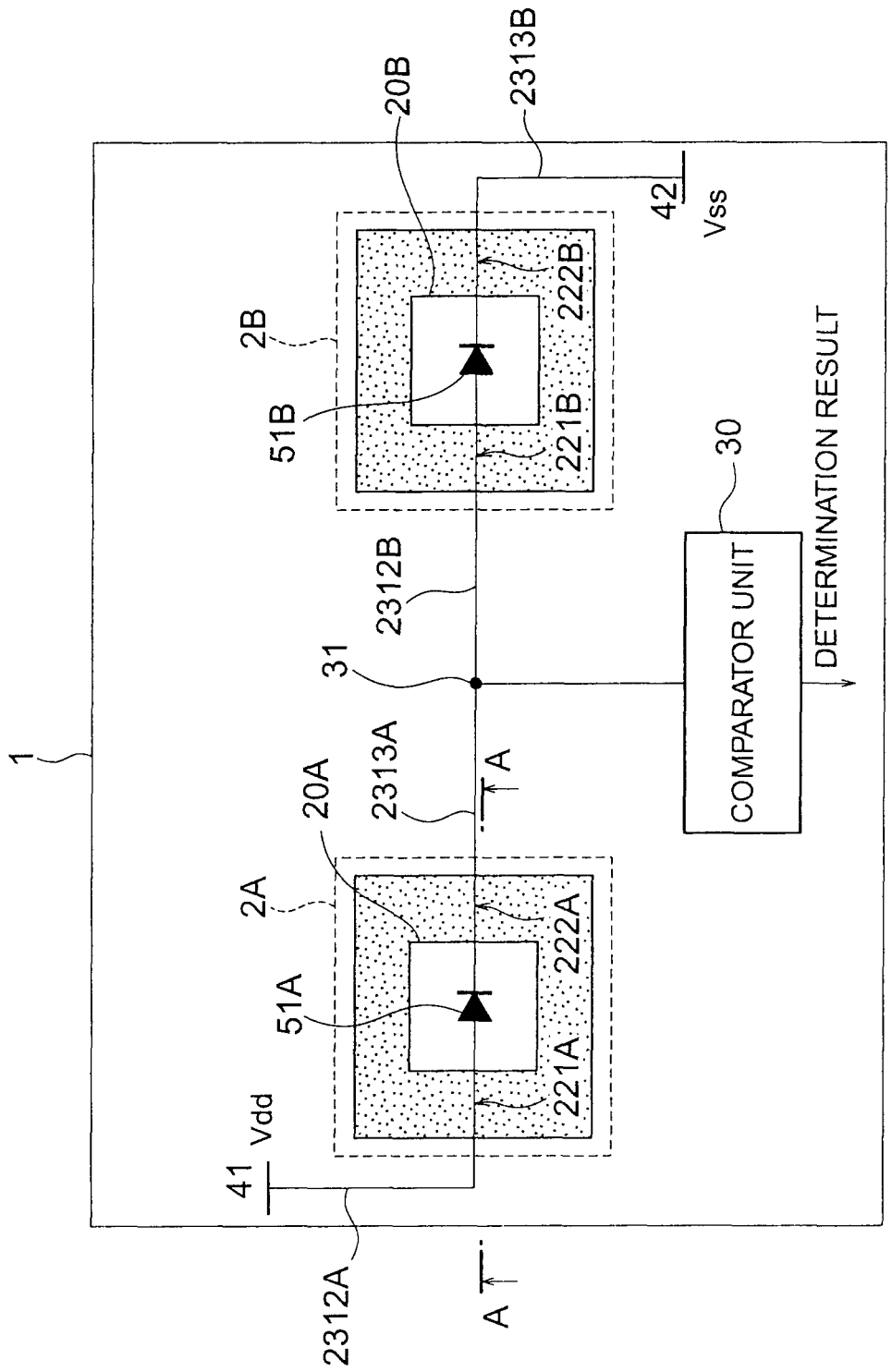
FIG. 4 is a plan view of a solid-state imaging element according to a second embodiment.
Figure 5:
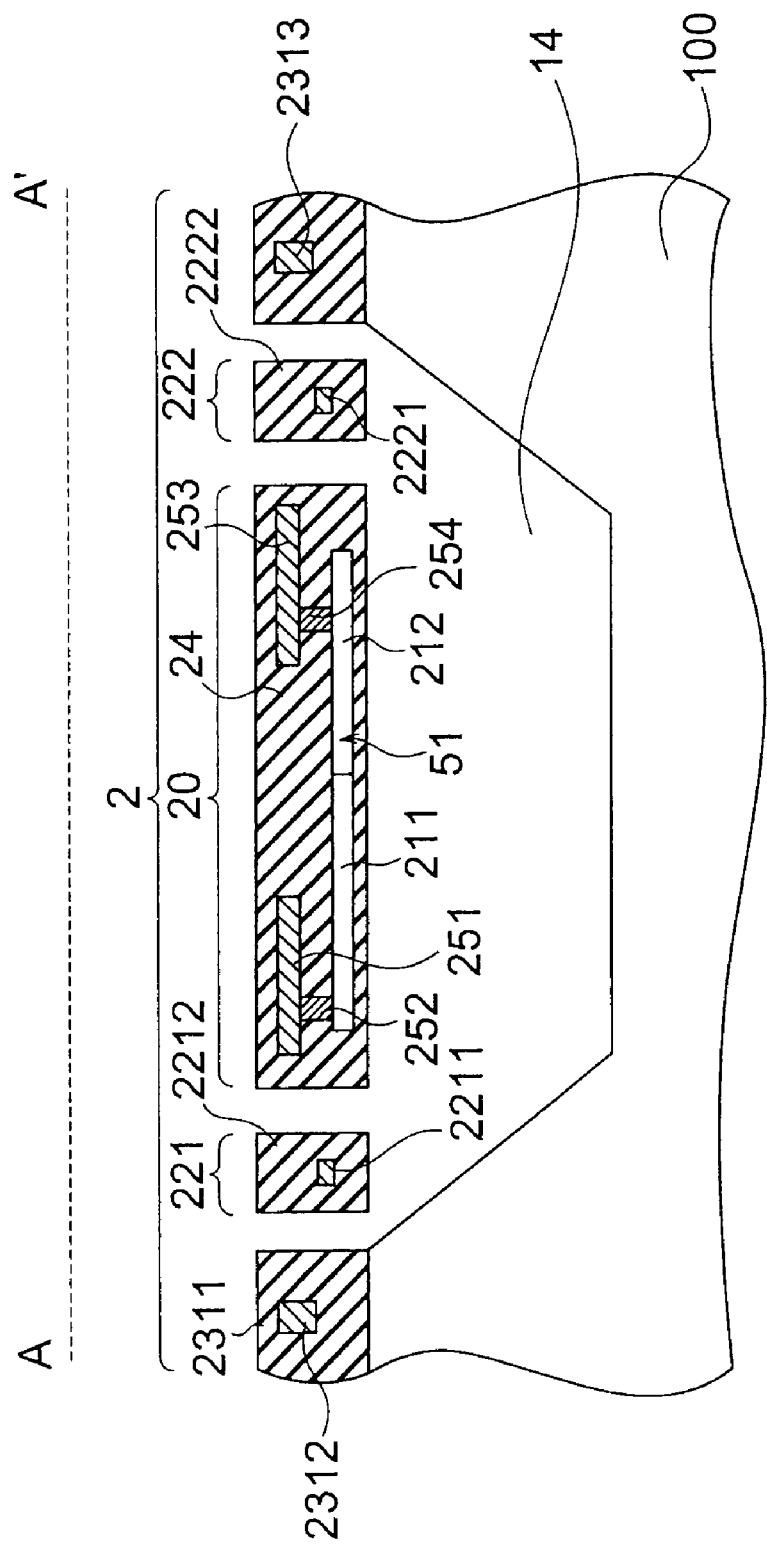
FIG. 5 is a cross-sectional view of the solid-state imaging element according to the second embodiment, taken along the line A-A of FIG. 4.

Referring now to FIGS. 4 and 5, a solid-state imaging element according to a second embodiment of the present invention is described. FIG. 4 is a plan view of the solid-state imaging element 1 of this embodiment. FIG. 5 is a cross-sectional view of the solid-state imaging element 1, taken along the line A-A of FIG. 4. The solid-state imaging element 1 of this embodiment is the same as the solid-state imaging element 1 of the first embodiment, except that each thermoelectric conversion element 21 formed by a resistor is replaced by a pn-junction diode 51. That is, a diode 51A is used as the thermoelectric conversion element in the pixel 2A, and a diode 51B is used as the thermoelectric conversion element in the pixel 2B.

Each diode 51 includes a p-type semiconductor layer 211 and an n-type semiconductor layer 212 formed in a lower portion of the cell unit 20. The p-type semiconductor layer 211 is connected to an interconnect 251 via a plug 252, and the interconnect 251 is connected to a connection interconnect 2211. The n-type semiconductor layer 212 is connected to an interconnect 253 via a plug 254, and the interconnect 253 is connected to a connection interconnect 2221.

In this embodiment, the temperature rise $\Delta T$ in each cell is detected by the diode 51 formed in a lower layer of the cell unit 20. The thermoelectric conversion rate of the diode 51 is expressed as dV/dT, and a voltage change dV is caused by the temperature rise $\Delta T$ in the cell unit 20. Accordingly, in a steady state, a voltage signal that is expressed by the following equation is output from the cell unit 20:

$$dV = \Delta T \cdot \frac{dV}{dT} = \frac{P_a}{G_{th}} \frac{dV}{dT} \quad (9)$$

Figure 6:
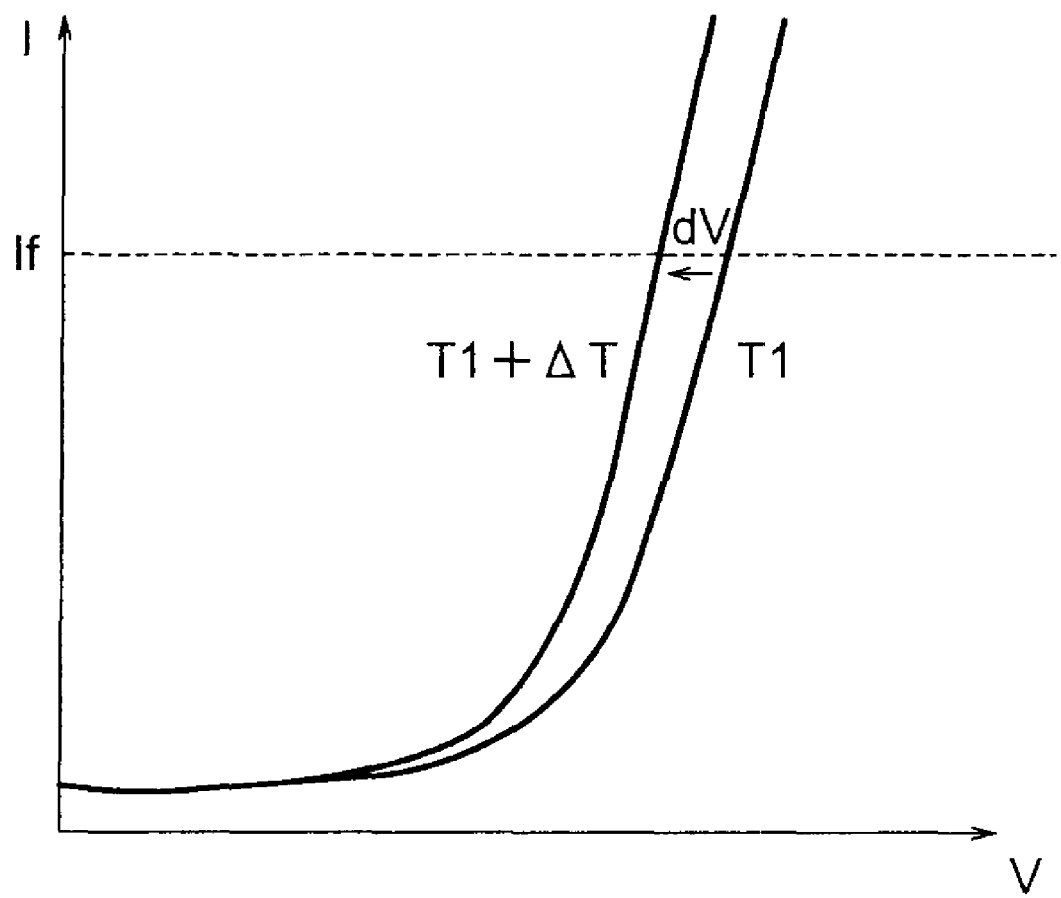
FIG. 6 is a diagram showing the voltage-current characteristics of a diode.

FIG. 6 shows the voltage-current characteristics of this diode.

The forward current of the diode 51 is expressed by the following equation using a forward voltage $V_f$:

$$If = A \cdot Is \cdot \{\exp(qV_f/kT) - 1\} \quad (10)$$

Here, A represents a pn junction area, Is represents a saturation current, q represents a charge quantum, k represents a Boltzmann constant, and T represents an absolute temperature. According to the equation (10), the following equation is obtained:

$$\frac{dV}{dT} = -\frac{1.21 - Vf}{T} \quad (11)$$

When the temperature of the cell unit 20 becomes higher, the forward voltage Vf becomes lower. Therefore, the resistance value of the diode 51 becomes lower. Where $\Delta R$ represents this change, $\Delta R$ becomes smaller than 0, and the sign becomes the opposite of that in the first embodiment. For example, in a case where infrared rays are emitted onto the pixel 2A, the difference between the voltage V31 of the node 31 and the threshold voltage Vth (=V31−Vth) is expressed as follows:

$$V_{31} - V_{th} = \frac{-\Delta R}{2(2R + \Delta R)}(Vdd - Vss) > 0 \quad (12)$$

In a case where infrared rays are emitted onto the pixel 2B, the difference becomes a negative value, and it is possible to determine which one of the pixels 2A and 2B has infrared rays emitted thereto.

In this embodiment, it is possible to determine readily and quickly the location of an object, as in the first embodiment. Furthermore, even if there is a change in background temperature or chip temperature, the output signal is not affected by such a change, because the output signal is the result of an output of the difference between two pixels.

A thermoelectric conversion element formed by a diode is easy to manufacture by a process generally used for silicon, and has a high output voltage with respect to infrared rays, as in this embodiment.

Third Embodiment

Figure 7:
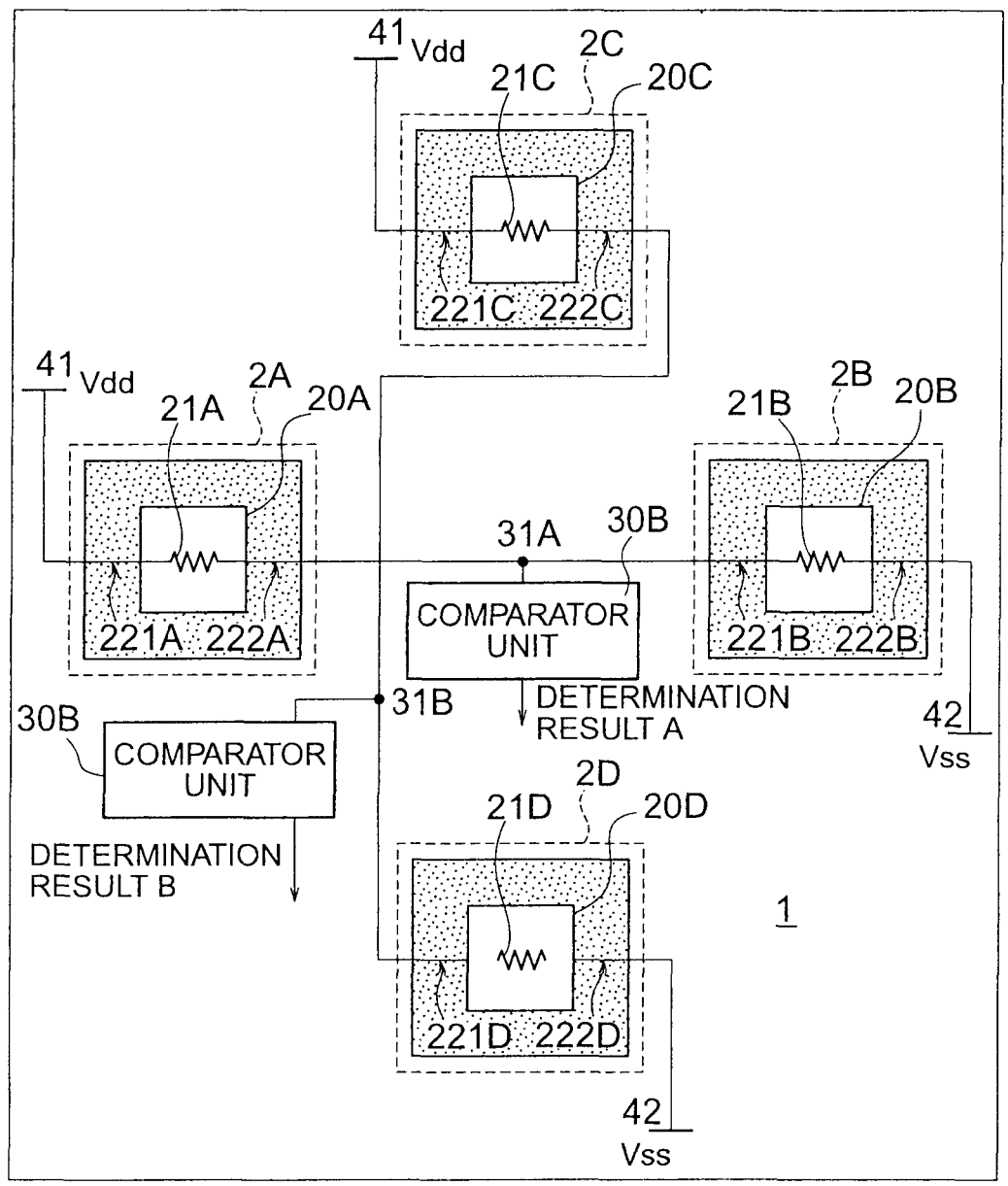
FIG. 7 is a plan view of a solid-state imaging element according to a third embodiment.

FIG. 7 shows a solid-state imaging element according to a third embodiment of the present invention. FIG. 7 is a plan view of the solid-state imaging element 1 of this embodiment. As shown in FIG. 7, the solid-state imaging element 1 of this embodiment has pixels 2A through 2D arranged in the left, right, upper, and lower positions, when viewed from the infrared incident direction (from the front side of the plane of paper in FIG. 7). The unit formed by the pixels 2A and 2B and a comparator unit 30A outputs a determination result A. A unit formed by the pixels 2C and 2D and a comparator unit 30B outputs a determination result B. The determination result A is at the low level when infrared rays are emitted onto the pixel 2A, and is at the high level when infrared rays are emitted onto the pixel 2B. The determination result B is at the low level when infrared rays are emitted onto the pixel 2C, and is at the high level when infrared rays are emitted onto the pixel 2D. In this manner, the solid-state imaging element 1 according to this embodiment outputs two kinds of information: the determination results A and B.

It is also possible to know in which region (the left region or the upper region, the left region or the lower region, the right region or the upper region, or the right region or the lower region) the object exists, depending on the combination of the determination results A and B.

According to this embodiment, it is possible to readily and quickly obtain the information about whether the object exists in the left or right region when seen from the side of the solid-state imaging element, as well as the information about whether the object exists in the upper or lower region. It should be noted that the method of arranging pixels and the number of pixels are not limited to those of this embodiment.

DESCRIPTION OF SYMBOLS 1 solid-state imaging element
2, 2A, 2B pixels (infrared detectors)
20 cell unit
21, 21A, 21B, 21C, 21D thermoelectric conversion elements
24 infrared absorbing layer
30 comparator unit 221 supporting beam
221A connection interconnect
221B connection interconnect
222 supporting beam
222A connection interconnect
222B connection interconnect
2312A interconnect
2312B interconnect
2313A interconnect
2313B interconnect

The invention claimed is:
1. A solid-state imaging element comprising:
at least two infrared detectors formed on a semiconductor substrate, each of the infrared detectors including thermoelectric conversion elements;
an electric interconnect configured to connect the at least two infrared detectors in series; and
a comparator unit configured to compare an intermediate voltage of the electric interconnect connecting the infrared detectors in series, with a predetermined reference voltage.
2. The element according to claim 1, wherein
each of the infrared detectors includes:
a first interconnect unit and a second interconnect unit formed on the semiconductor substrate;
a first supporting beam and a second supporting beam placed above a concave portion formed in a surface area of the semiconductor substrate, the first supporting beam and the second supporting beam having a first connection interconnect and a second connection interconnect that are electrically connected to the first interconnect unit and the second interconnect unit, respectively; and
a cell unit placed above the concave portion, the cell unit being supported by the first supporting beam and the second supporting beam, and
the cell unit includes:
an infrared absorbing layer absorbing an incident infrared ray; and
the thermoelectric conversion elements each generating an electrical signal by detecting a temperature change in the cell unit, the thermoelectric conversion elements being electrically connected to the first supporting beam and the second supporting beam, the thermoelectric conversion elements being electrically insulated from the infrared absorbing layer.
3. The element according to claim 1, wherein the thermoelectric conversion elements are resistors.
4. The element according to claim 1, wherein the thermoelectric conversion elements are pn-junction diodes.
5. The element according to claim 1, wherein
the comparator unit includes:
a noninverting amplifier circuit configured to include a positive input terminal to which the intermediate voltage of the electric interconnect is input, and an inverting input terminal, an output of the noninverting amplifier circuit being divided by at least two resistances connected in series and a divided output of the noninverting amplifier circuit being input to the inverting input terminal; and
a comparator configured to compare an output of the noninverting amplifier circuit with the reference voltage.
6. The element according to claim 1, wherein
the number of the infrared detectors is four, two of the infrared detectors and the other two of the infrared detectors are arranged in directions perpendicular to each other, and
the solid-state imaging element further comprises a first electric interconnect electrically connecting the two of the infrared detectors, and a second electric interconnect electrically connecting the other two of the infrared detectors.
7. The element according to claim 6, wherein the comparator unit includes a first comparator circuit configured to compare an intermediate voltage of the first electric interconnect with a first reference voltage, and a second comparator circuit configured to compare an intermediate voltage of the second electric interconnect with a second reference voltage.

* * * * *